US011384428B2

(12) United States Patent
Ling et al.

(10) Patent No.: US 11,384,428 B2
(45) Date of Patent: Jul. 12, 2022

(54) CARBON LAYER COVERED MASK IN 3D APPLICATIONS

(71) Applicant: Applied Materials, Inc., Santa Clara, CA (US)

(72) Inventors: Mang-Mang Ling, San Jose, CA (US); Thomas Kwon, Dublin, CA (US); Jong Mun Kim, San Jose, CA (US); Chentsau Chris Ying, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/904,396

(22) Filed: Jun. 17, 2020

(65) Prior Publication Data
US 2021/0017641 A1    Jan. 21, 2021

Related U.S. Application Data

(60) Provisional application No. 62/876,153, filed on Jul. 19, 2019.

(51) Int. Cl.
| | | |
|---|---|---|
| *C23C 16/04* | (2006.01) | |
| *C23C 16/26* | (2006.01) | |
| *H01L 27/11582* | (2017.01) | |
| *H01L 27/11556* | (2017.01) | |
| *H01L 27/1157* | (2017.01) | |
| *H01L 27/11524* | (2017.01) | |
| *C23C 14/35* | (2006.01) | |
| *C23C 14/04* | (2006.01) | |
| *C23C 16/511* | (2006.01) | |
| *C23C 14/58* | (2006.01) | |
| *C23C 14/06* | (2006.01) | |

(52) U.S. Cl.
CPC ............ *C23C 16/042* (2013.01); *C23C 16/26* (2013.01); *H01L 27/1157* (2013.01); *H01L 27/11524* (2013.01); *H01L 27/11556* (2013.01); *H01L 27/11582* (2013.01); *C23C 14/042* (2013.01); *C23C 14/0605* (2013.01); *C23C 14/357* (2013.01); *C23C 14/5873* (2013.01); *C23C 16/511* (2013.01)

(58) Field of Classification Search
CPC . C23C 14/042; C23C 14/0605; C23C 14/357; C23C 14/5873; C23C 16/042; C23C 16/26; C23C 16/511; H01L 27/11582; H01L 27/11556; H01L 27/1157; H01L 27/11524
USPC .......................................... 427/122, 282, 575
See application file for complete search history.

(56) References Cited

U.S. PATENT DOCUMENTS

| | | | |
|---|---|---|---|
| 9,184,060 B1 * | 11/2015 | Lee .................... | H01L 21/0337 |
| 9,305,804 B2 | 4/2016 | Kim et al. | |
| 9,589,832 B2 | 3/2017 | Shimizu et al. | |

(Continued)

*Primary Examiner* — Brian K Talbot
(74) *Attorney, Agent, or Firm* — Patterson + Sheridan, LLP

(57) ABSTRACT

Embodiments of the present disclosure generally relate to a method for forming an opening using a mask. In one embodiment, a method includes forming a mask on a feature layer. The method includes forming a first opening in the mask to expose a portion of the feature layer. The method further includes forming a carbon layer on the mask and the exposed portion of the feature layer. The method also includes removing portions of the carbon layer and a portion of the exposed portion of the feature layer in order to form a second opening in the feature layer.

20 Claims, 9 Drawing Sheets

(56) References Cited

U.S. PATENT DOCUMENTS

| | | |
|---|---|---|
| 10,410,864 B2 | 9/2019 | Kwon et al. |
| 2016/0064500 A1* | 3/2016 | Chen ................. H01L 27/11582 |
| | | 257/315 |
| 2016/0307764 A1* | 10/2016 | Gupta ............... H01L 21/30621 |
| 2016/0351407 A1* | 12/2016 | Sawataishi .......... H01L 21/3065 |
| 2017/0207088 A1* | 7/2017 | Kwon .............. H01L 21/31144 |
| 2019/0131140 A1* | 5/2019 | Sun ................... H01L 21/31122 |
| 2019/0185996 A1 | 6/2019 | Jha et al. |
| 2019/0206696 A1* | 7/2019 | Hsu .................. H01L 27/11582 |
| 2020/0203374 A1 | 6/2020 | Kwon et al. |
| 2020/0266202 A1 | 8/2020 | Kwon et al. |

* cited by examiner

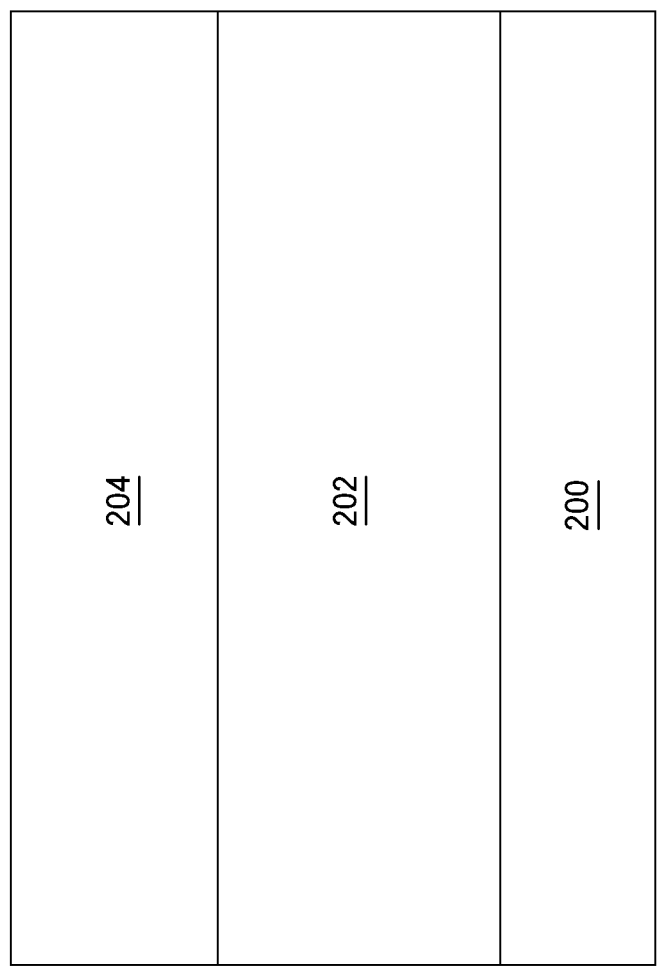

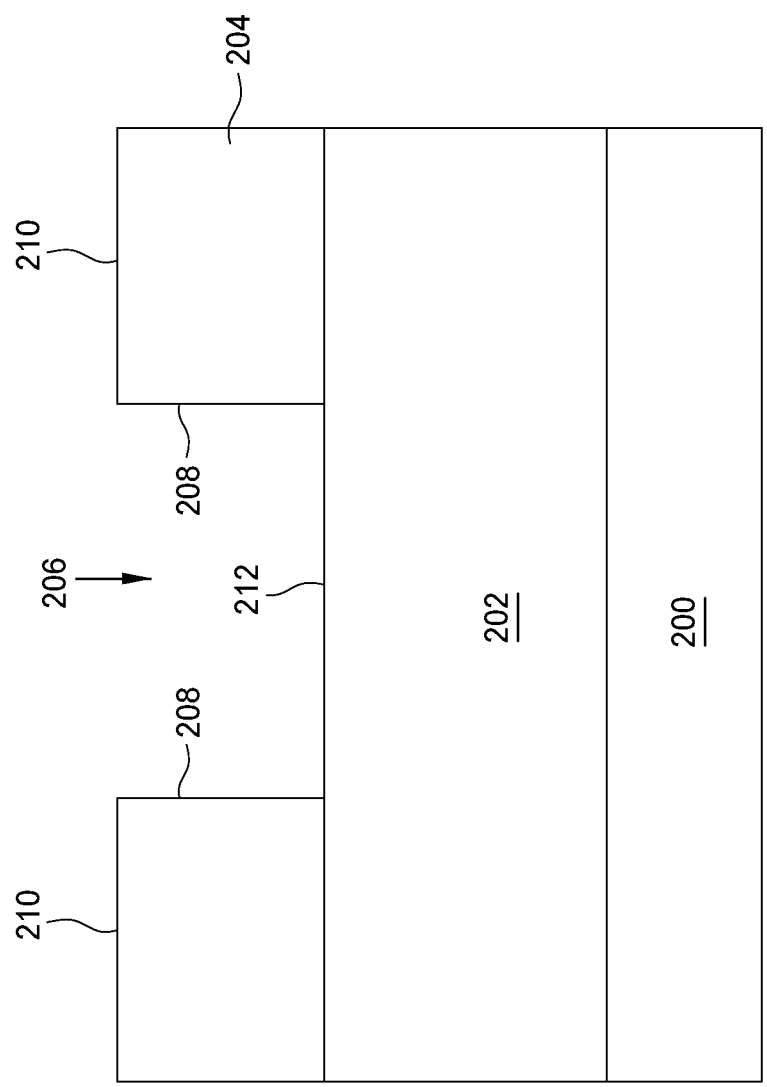

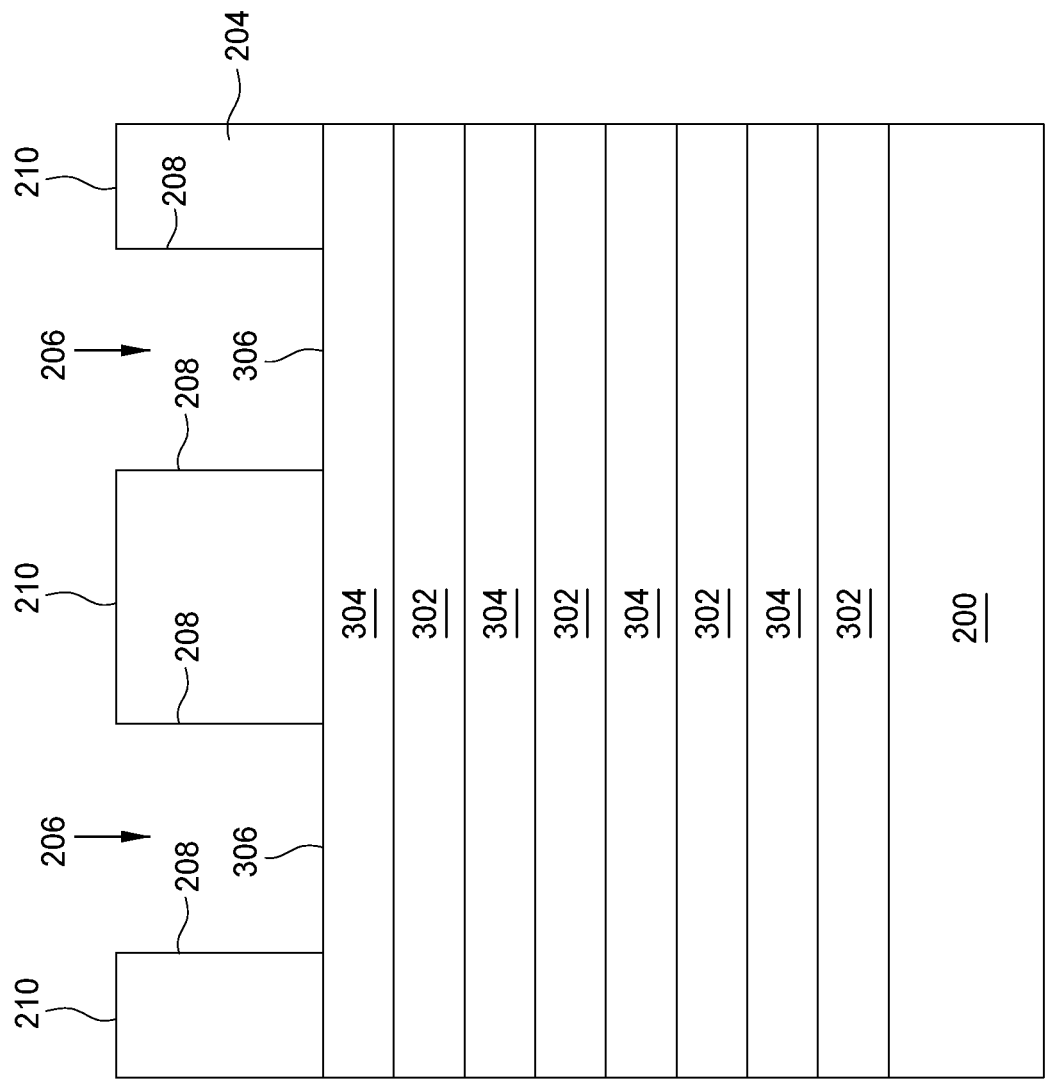

CARBON LAYER COVERED MASK IN 3D APPLICATIONS

CROSS-REFERENCE TO RELATED APPLICATIONS

This application claims benefit of U.S. Provisional Application Ser. No. 62/876,153, filed Jul. 19, 2019, all of which is incorporated by reference in its entirety.

BACKGROUND

Field

Embodiments of the present disclosure generally relate to semiconductor manufacturing, and in particular, to a method for forming an opening using a mask.

Description of the Related Art

Decreasing the dimensions of semiconductor devices and increasing the level of their integration are two of the major trends in the current semiconductor device manufacturing. As a result of these trends, the density of elements forming a semiconductor device continuously increases. The shrinkage of the semiconductor devices down to submicron dimensions requires that the routine fabrication of their elements also be performed on the submicron level. In addition, to increase the level of the device integration, semiconductor structures forming semiconductor devices may be stacked on top of each other. Typically, a three dimensional (3D) system refers to a system manufactured by stacking substrates, chips, or both and interconnecting them vertically using vias to achieve performance improvements at reduced power and smaller footprint than conventional two-dimensional processes. An example of the 3D system is V-NAND flash memory.

Generally, plasma etching is a form of plasma processing used to fabricate integrated circuits. Typically, a chip is fabricated using many layers of films. Each of these layers may be created using a mask that dictates the pattern of the layer. The accuracy of this pattern is extremely critical in manufacturing the chip. Generally, hard masks are used for etching deep, high aspect ratio (HAR) features that conventional photoresists cannot withstand. Typically, during the etching process free radicals react with the mask material and erode the mask. As a result, the mask integrity during the etching process is not maintained that negatively affects the accuracy of the pattern crucial in the semiconductor chip manufacturing.

Therefore, an improved method for forming an opening using a mask is needed.

SUMMARY

Embodiments of the present disclosure generally relate to a method for forming an opening using a mask. In one embodiment, a method includes forming a mask on a feature layer. The method includes forming a first opening in the mask to expose a portion of the feature layer. The method further includes forming a carbon layer on the mask and the exposed portion of the feature layer. The method also includes removing portions of the carbon layer and a portion of the exposed portion of the feature layer in order to form a second opening in the feature layer.

In another embodiment, a method includes forming a mask on alternating layer. The method includes forming a first plurality of openings in the mask to expose portions of the alternating layers. The method also includes forming a carbon layer on the mask and the exposed portions of the alternating layers. The method further includes removing portions of the carbon layer and portions of the exposed portions of the alternating layers to form a second plurality of openings in the alternating layers.

In another embodiment, a method includes forming a mask on a feature layer. The method includes patterning the mask to form a patterned mask having a first plurality of openings in the mask to expose portions of the feature layer. The method further includes forming a carbon layer on the mask and the exposed portions of the feature layer. Additionally, the method includes forming a second plurality of openings in the feature layer. The patterned mask includes opposite sides covered by portions of the carbon layer after the second plurality of openings is formed.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 2A-2D illustrate exemplary schematic side views of a portion of a stack of layers during different stages of the method of FIG. 1, according to an embodiment.

FIGS. 3A-3D illustrate exemplary schematic side views of a portion of a 3D system during different stages of forming the 3D system, according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a method for forming an opening using a mask. In one embodiment, the method includes forming a mask on a feature layer. An opening is formed in the mask to expose a portion of the feature layer and an edge of the mask. The method also includes forming a carbon layer on the mask and the exposed portion of the feature layer. The carbon layer is disposed on the edge of the mask. The method further includes forming an opening in the feature layer. The opening in the feature layer is formed by a directional etch process, and the carbon layer disposed on the edge of the mask protects the mask and maintains the shape of the mask. Advantageously, profile issues, such as bowing, top faceting, or tapering, of the opening in the feature layer are reduced.

Figure 1:
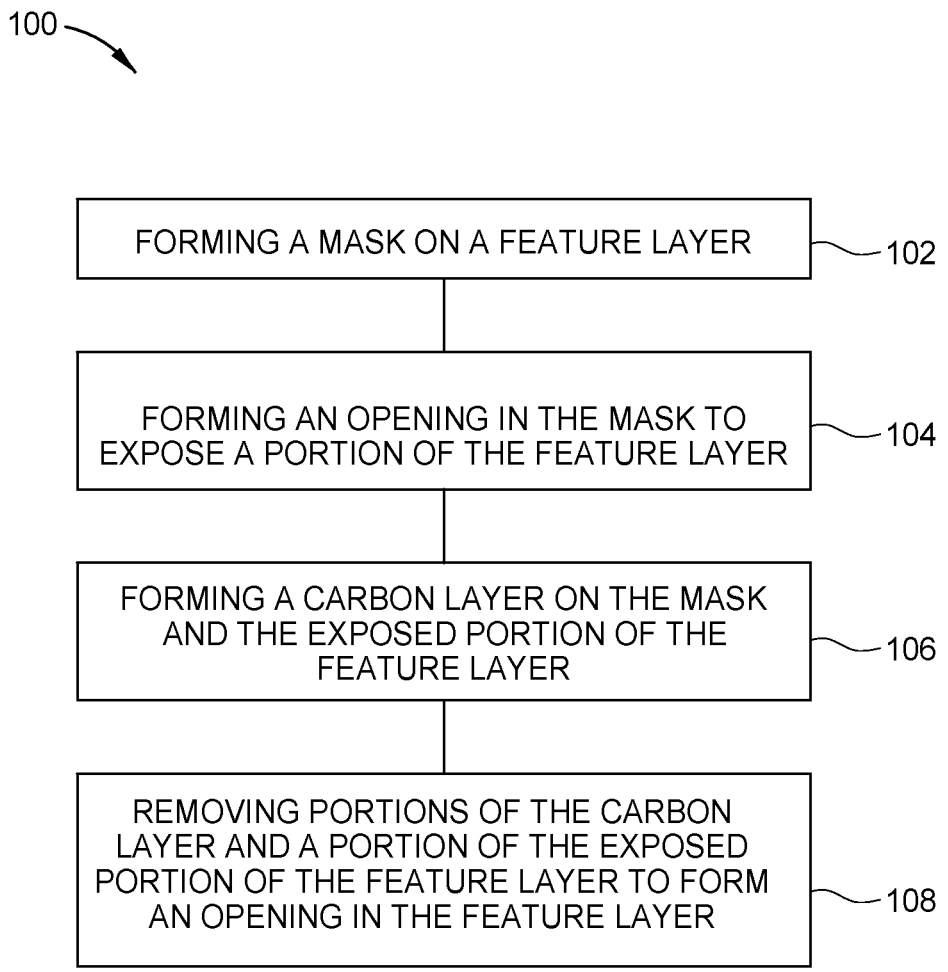
FIG. 1 is a flow diagram of a method for forming an opening using a mask, according to an embodiment.
Figure 2C:
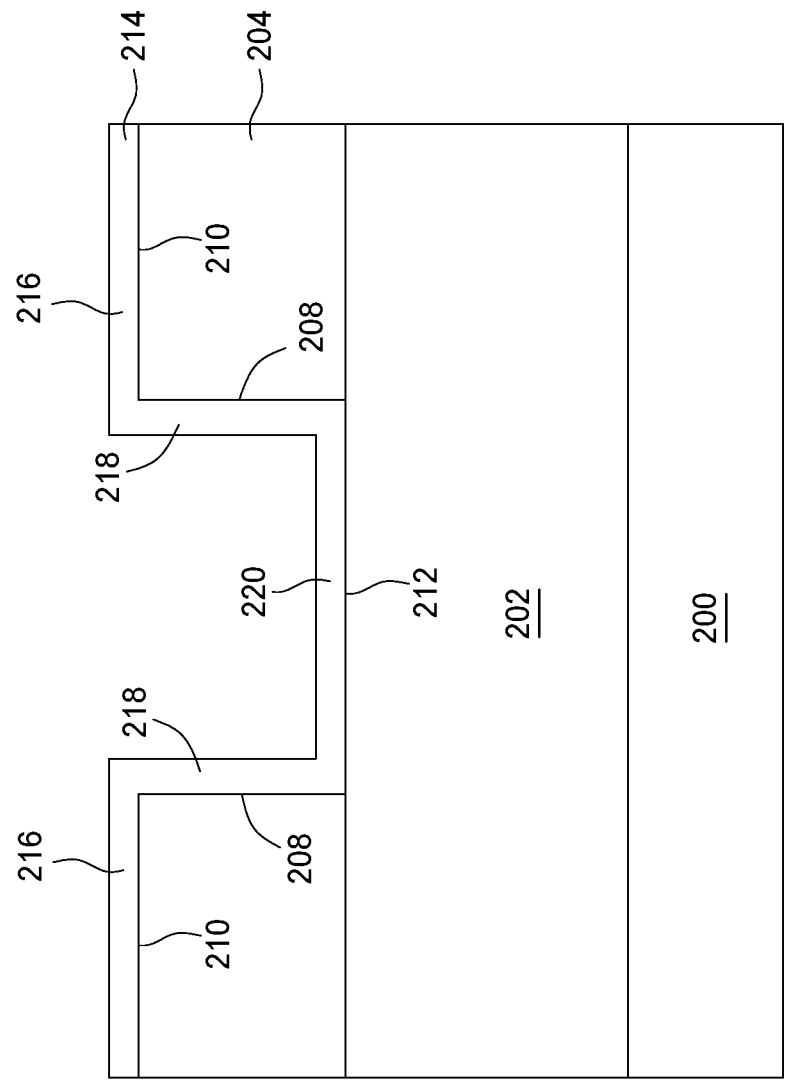

FIG. 1 is a flow diagram of a method 100 for forming an opening using a mask. FIGS. 2A-2D illustrate schematic cross-sectional views of a portion of a stack of layers during different stages of the method of FIG. 1. The method 100 starts at operation 102 by forming a mask 204 on a feature layer 202, as shown in FIG. 2A. The feature layer 202 is disposed on a substrate 200. In one embodiment, the substrate 200 includes a semiconductor material, e.g. silicon (Si), germanium (Ge), silicon germanium (SiGe), a Group III-V based material, e.g. gallium arsenide (GaAs), or any combination thereof. The substrate 200 may include metallization interconnect layers for integrated circuits. In some embodiments, the substrate 200 includes electronic devices, e.g., transistors, memories, capacitors, resistors, optoelectronic devices, switches, and any other active and passive electronic devices that are separated by an electrically insulating layer. For example, the electrically insulating layer can be an interlayer dielectric, a trench insulation layer, or any other insulating layer known to one of ordinary skill in the art of the electronic device manufacturing. In some embodiments, the substrate 200 includes interconnects, e.g. vias, configured to connect the metallization layers.

The substrate 200 may be a semiconductor-on-isolator (SOI) substrate including a bulk lower substrate, a middle insulation layer, and a top monocrystalline layer. The top monocrystalline layer may be any material listed above, e.g., silicon. In one example, the substrate 200 includes an insulating layer, e.g. an oxide layer or nitride layer, such as silicon oxide, aluminum oxide, silicon oxide nitride, silicon nitride, or any combinations thereof. The insulating layer of the substrate 200 may include an interlayer dielectric (ILD) made of silicon dioxide.

The feature layer 202 includes one or more insulating layers, one or more conductive layers, one or more semiconductor layers, or any combinations thereof to manufacture one or more microelectronic devices. In one example, the feature layer 202 is an insulating layer, such as an oxide layer or nitride layer, e.g., silicon oxide, aluminum oxide ($Al_2O_3$), silicon oxide nitride (SiON), or silicon nitride. In one embodiment, the feature layer 202 is a stack of layers. For example, the feature layer 202 includes alternate oxide and nitride layers.

The feature layer 202 may be a semiconductor material, e.g., monocrystalline silicon (Si), polycrystalline Si, amorphous Si, germanium (Ge), silicon germanium (SiGe), a Group III-V based material (e.g., gallium arsenide (GaAs)), or any combinations thereof. In one embodiment, the feature layer 202 is made of a metal, for example, copper (Cu), aluminum (Al), indium (In), tin (Sn), lead (Pb), silver (Ag), antimony (Sb), bismuth (Bi), zinc (Zn), cadmium (Cd), gold (Au), ruthenium (Ru), nickel (Ni), cobalt (Co), chromium (Cr), iron (Fe), manganese (Mn), titanium (Ti), hafnium (Hf), tantalum (Ta), tungsten (W), vanadium (V), molybdenum (Mo), palladium (Pd), platinum (Pt), other conductive metal known to one of ordinary skill in the art of electronic device manufacturing, or any combinations thereof.

The mask 204 may be any suitable mask for protecting regions of layers covered by the mask 204. In one embodiment, the mask 204 is a hard mask made of doped carbon, such as boron doped amorphous carbon. The mask 204 may be a Saphira™ hard mask produced by Applied Materials, Inc., located in Santa Clara, Calif. In one embodiment, the mask 204 includes one or more of Advanced Patterning Film (APF) carbon hard masks produced by Applied Materials, Inc., located in Santa Clara, Calif.

At operation 104, an opening 206 is formed in the mask 204 to expose a portion 212 of the feature layer 202, as shown in FIG. 2B. The opening 206 may be a hole or a trench. The opening 206 may be formed by any suitable method, such as plasma etching. The opening 206 is defined by the exposed portion 212 of the feature layer 202 and one or more sidewalls 208 of the mask 204. The mask 204 has a top surface 210.

At operation 106, a carbon layer 214 is formed on the mask 204 and the exposed portion 212 of the feature layer 202, as shown in FIG. 2C. The carbon layer 214 includes a first portion 216 disposed on the top surface 210 of the feature layer 202. Additionally, the carbon layer 214 includes a second portion 218 disposed on the one or more sidewalls 208 of the mask 204. The carbon layer 214 also includes a third portion 220 disposed on the exposed portion 212 of the feature layer 202. The carbon layer 214 is conformal and in one embodiment is formed by microwave-assisted chemical vapor deposition (CVD) process. The carbon layer 214 may have a thickness ranging from about 1 nm to about 10 nm. The carbon layer 214 is made of a different material than the mask 204. In one embodiment, the carbon layer 214 is a graphene layer. In another embodiment, the carbon layer 214 is a plurality of graphene layers, such as a graphite layer having the plurality of graphene layers. The graphene layers may be formed by a microwave-assisted CVD process in a microwave-assisted CVD chamber. In one embodiment, the microwave-assisted CVD process includes flowing one or more carbon-containing precursor gases, such as methane or acetylene, at a low flow rate into the chamber. The low flow rate can be from about 1 sccm to about 20 sccm. The chamber pressure may be maintained at about 10 to 20 mTorr, and the substrate temperature may be maintained at about 500 degrees Celsius to about 1000 degrees Celsius during the microwave-assisted CVD process. The carbon layer 214, such as the graphene layer or layers, is conformal as the result of the microwave assisted CVD process.

Figure 2D:
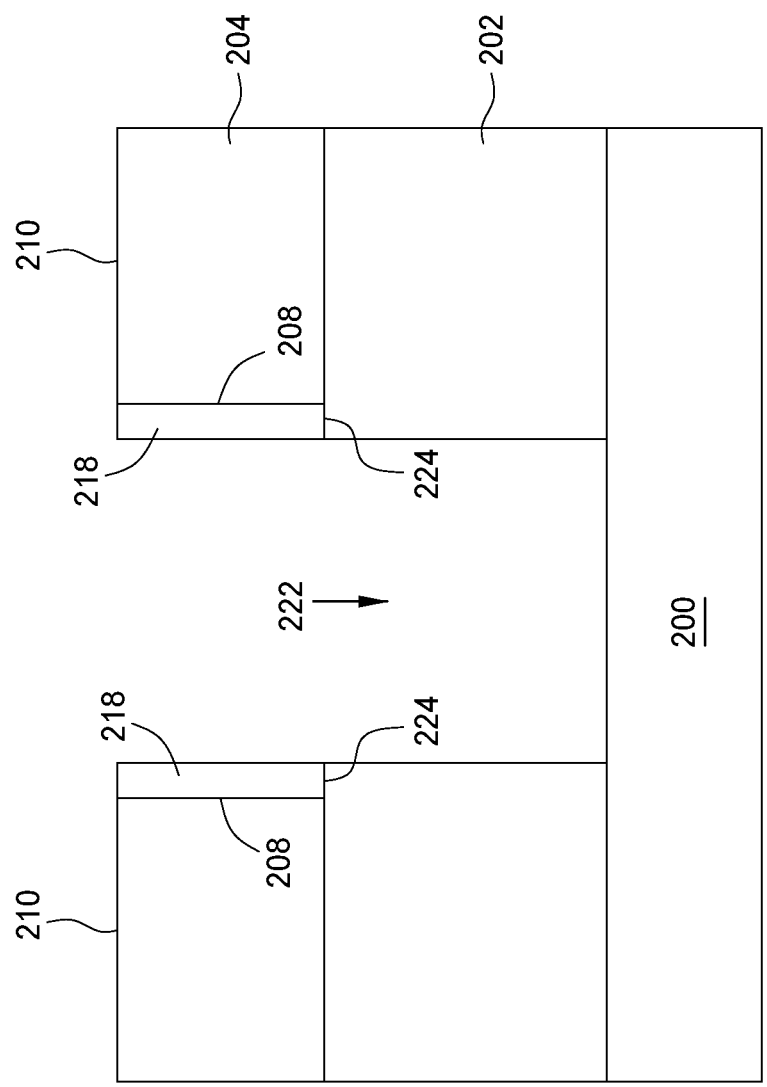

At operation 108, the first portion 216, the third portion 220 of the carbon layer 214, and a portion of the exposed portion 212 of the feature layer 202 disposed under the third portion 220 of the carbon layer 214 are removed to form an opening 222 in the feature layer 202, as shown in FIG. 2D. The opening 222 may be a hole or a trench. The opening 222 may have a high aspect ratio, such as greater than 15:1. The portions 216, 220 of the carbon layer 214 and the portion of the feature layer 202 are removed by a directional plasma etching process utilizing a fluorine-based chemistry, in one embodiment. In one such example, during the directional plasma etching process, reactive species of $SF_6$ or $NF_3$ are pulled towards the substrate 200 due to the biasing of the substrate 200. The reactive species are substantially perpendicular to the substrate 200 and may physically remove or sputter one or more layers on the substrate 200. Because the carbon layer 214 is resistive to the fluorine-based chemistry, the first portion 216 and the third portion 220 of the carbon layer 214 are physically, not chemically, removed by the reactive species. The second portion 218 is not substantially affected by the reactive species as the result of the directional etch. As shown in FIG. 2D, the second portion 218 is disposed on a remaining portion 224 of the exposed portion 212 of the feature layer 202 at the end of the directional etch process. The shape of the mask 204 is maintained by the second portion 218 of the carbon layer 214. Advantageously, profile issues, such as bowing, top faceting, or tapering, of the opening 222 in the feature layer 202 are reduced.

In some embodiments, a material is deposited in the opening 222. In one embodiment, an electrically conductive material, such as a metal, is deposited in the opening 222 as an interconnect in a V-NAND flash memory. In another embodiment, a dielectric material is deposited in the opening 222 as a channel hole in a V-NAND flash memory.

FIGS. 3A-3D illustrate schematic side views of a portion of a 3D system during different stages of forming the 3D system, according to one embodiment. As shown in FIG.

3A, alternating layers 302, 304 are disposed on the substrate 200, and the mask 204 is disposed on the alternating layers 302, 304. The layer 302 is an oxide, such as silicon oxide, germanium oxide, gallium oxide, tantalum oxide, aluminum oxide, titanium oxide, or other suitable oxide. The layer 304 is a nitride, such as silicon nitride, germanium nitride, gallium nitride, tantalum nitride, aluminum nitride, titanium nitride, or other suitable nitride.

Figure 3A:
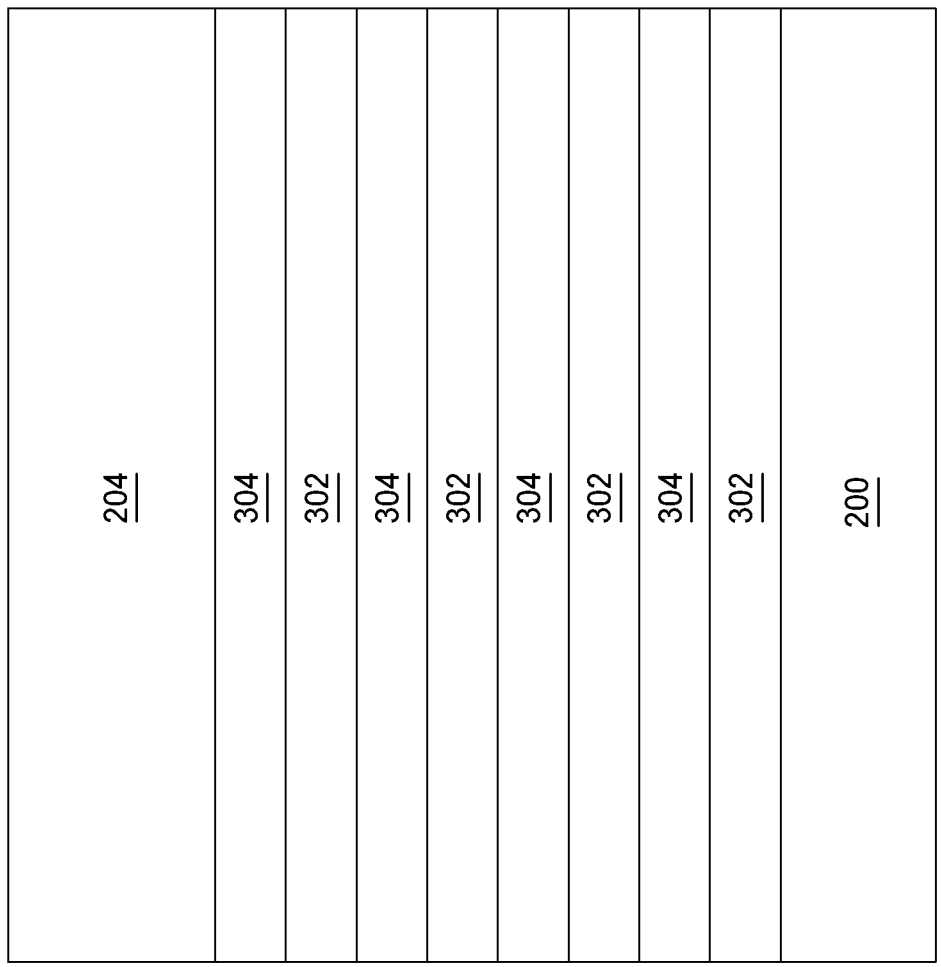
Figure 3C:
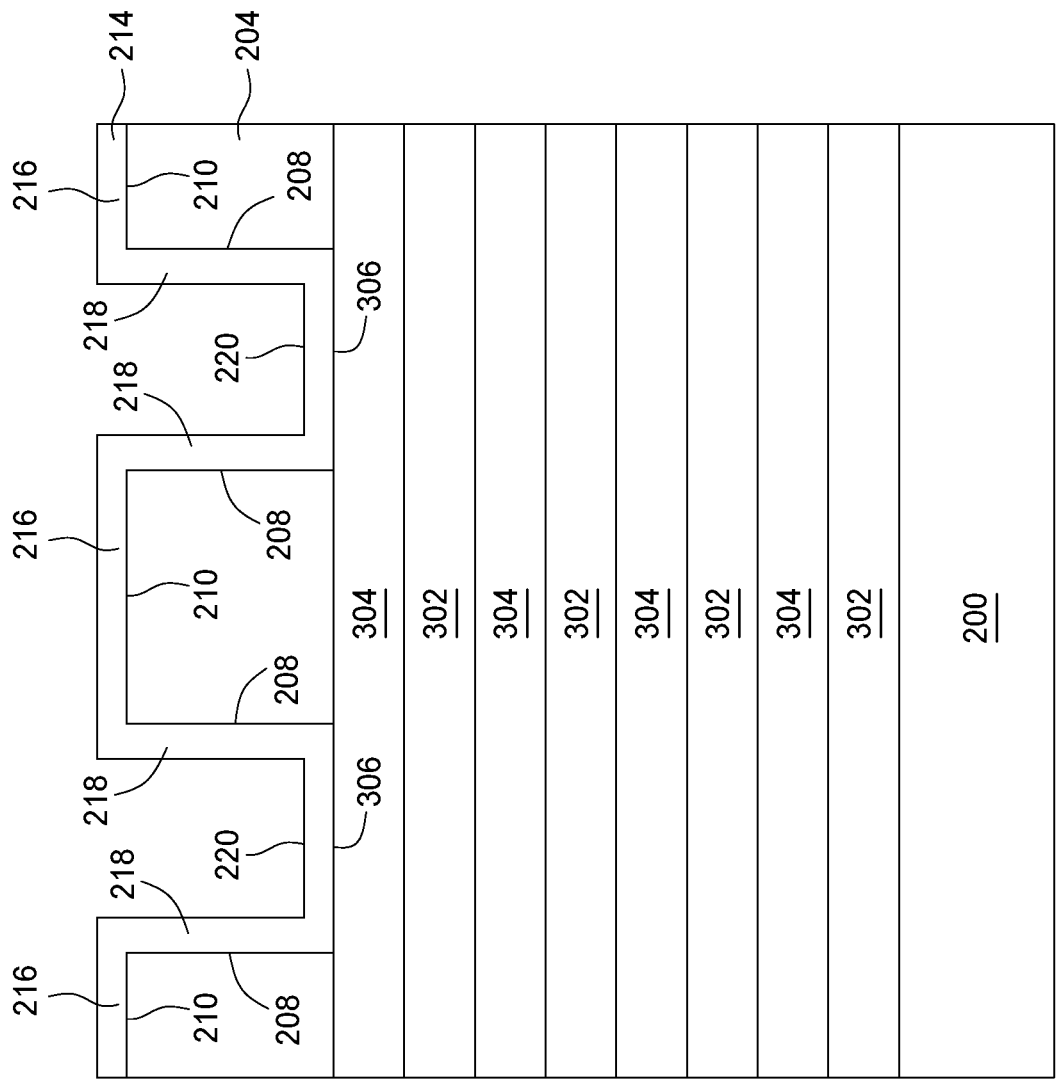

Next, as shown in FIG. 3B, the openings 206 are formed in the mask 204, creating the sidewalls 208, the top surfaces 210 of the mask 204, and exposed portions 306 of the layer 304 (or layer 302). The openings 206 may be formed as a result of patterning the mask 204. The carbon layer 214 is formed on the mask 204 and the exposed portions 306, as shown in FIG. 3C. The carbon layer 214 includes the first portions 216 disposed on the top surfaces 210, as shown in FIG. 2C. The second portions 218, shown in FIG. 2D is disposed on the sidewalls 208, and the third portions 220 (shown in FIG. 2C) is disposed on the exposed portions 306, illustrated in FIGS. 3B and 3C.

Figure 3D:
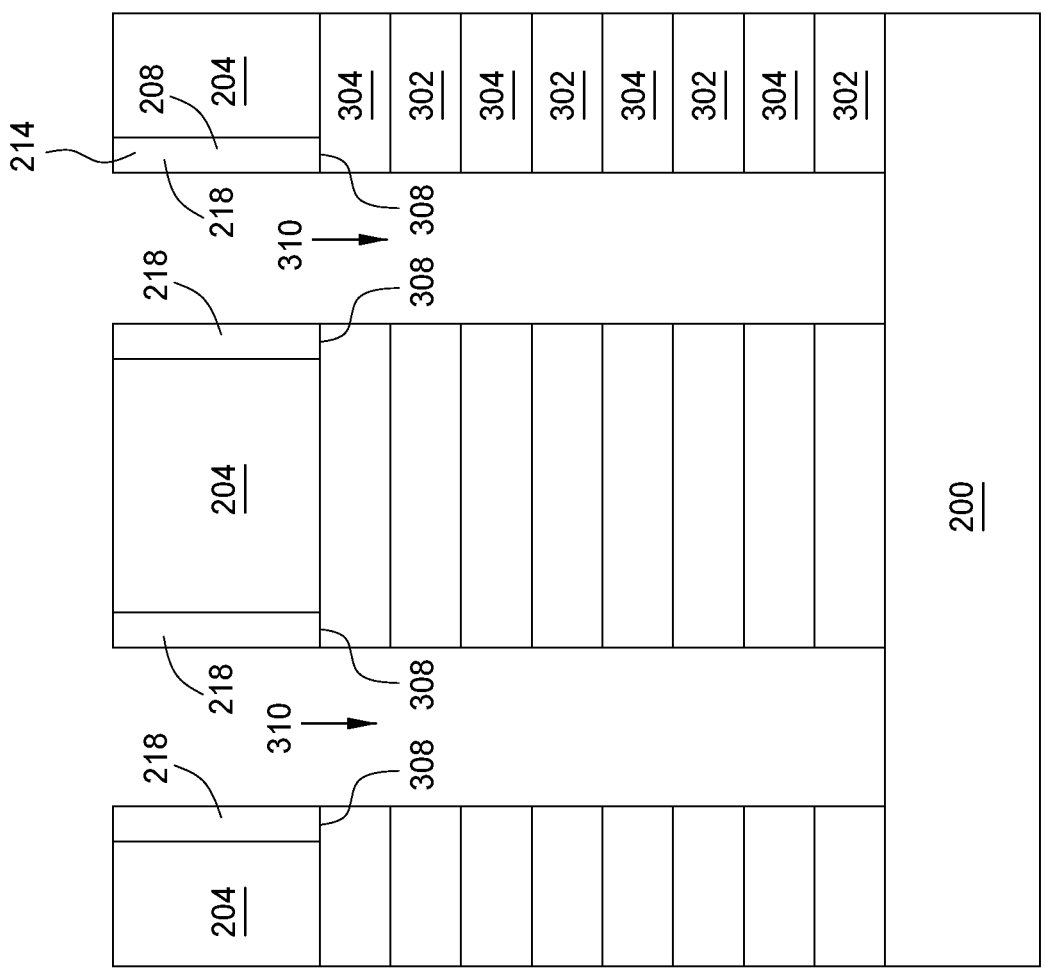

Next, as shown in FIG. 3C, the first portions 216, the third portions 220 of the carbon layer 214, and portions of the exposed portions 306 disposed under the third portion 220 of the carbon layer 214 are removed to form openings 310, illustrated in FIG. 3D, in the alternating layers 302, 304. Each of the openings 310 shown in FIG. 3D may be the same as the opening 222 shown in FIG. 2D. The portions 216, 220 of the carbon layer 214 and the portions of the exposed portion 306 are removed by a directional plasma etching process utilizing a fluorine-based chemistry. In one example, during the directional plasma etching process, reactive species of $SF_6$ or $NF_3$ are pulled towards the substrate 200 due to the biasing of the substrate 200. The reactive species are substantially perpendicular to the substrate 200 and may physically remove or sputter one or more layers on the substrate 200. Because the carbon layer 214 is resistive to the fluorine-based chemistry, the first portions 216 and the third portions 220 of the carbon layer 214 are physically, not chemically, removed by the reactive species. The second portions 218 are not substantially affected by the reactive species. As shown in FIG. 3D, the second portions 218 are disposed on remaining portions 308 of the exposed portions 306 at the end of the directional etch process. The shape of the mask 204 is maintained by the second portions 218 of the carbon layer 214. For example, opposite sides of the mask 204 are covered and protected by the second portions 218 during the directional etch process. Beneficially, profile issues, such as bowing, top faceting, or tapering, of the opening 310 in the alternating layers 302, 304 are reduced.

A conformal carbon layer is utilized to protect a patterned mask, which in turn reduces profile issues, such as bowing, top faceting, or tapering, of one or more openings formed in the one or more layers disposed below the patterned mask. The conformal carbon layer may be one or more graphene layers and is formed by a microwave CVD process. The one or more graphene layers formed by microwave CVD process are conformal.

While the foregoing is directed to embodiments of the present disclosure, other and further embodiments of the disclosure may be devised without departing from the basic scope thereof, and the scope thereof is determined by the claims that follow.

What is claimed is:

1. A method, comprising:
    forming a mask on a feature layer;
    forming a first opening in the mask to expose a portion of the feature layer;
    forming a carbon layer on the mask and the exposed portion of the feature layer, the carbon layer having first portions and a second portion; and
    removing first portions of the carbon layer and a portion of the exposed portion of the feature layer to form a second opening, the second opening formed in the feature layer, wherein a second portion of the carbon layer is disposed on one or more sidewalls of the mask after removing the first portions of the carbon layer.

2. The method of claim 1, wherein the mask comprises doped carbon.

3. The method of claim 2, wherein the feature layer comprises silicon, germanium, silicon germanium, silicon oxide, aluminum oxide, silicon oxide nitride, or silicon nitride.

4. The method of claim 2, wherein the feature layer comprises a metal.

5. The method of claim 2, wherein the carbon layer comprises a graphene layer.

6. The method of claim 2, wherein the carbon layer comprises a plurality of graphene layers.

7. The method of claim 6, wherein the plurality of graphene layers is formed by a microwave-assisted chemical vapor deposition process.

8. A method, comprising:
    forming a mask on alternating layers;
    forming a first plurality of openings in the mask to expose portions of the alternating layers;
    forming a carbon layer on the mask and the exposed portions of the alternating layers, the carbon layer having first portions and a second portion; and
    removing first portions of the carbon layer and portions of the exposed portions of the alternating layers to form a second plurality of openings in the alternating layers, wherein the second portion of the carbon layer is disposed on one or more sidewalls of the mask after removing the first portions of the carbon layer.

9. The method of claim 8, wherein the mask comprises doped carbon.

10. The method of claim 9, wherein the mask comprises boron doped carbon.

11. The method of claim 9, wherein the carbon layer comprises a graphene layer.

12. The method of claim 9, wherein the carbon layer comprises a plurality of graphene layers.

13. The method of claim 12, wherein the plurality of graphene layers is formed by a microwave-assisted chemical vapor deposition process.

14. The method of claim 12, wherein the plurality of graphene layers having a thickness ranging from about 1 nm to about 10 nm.

15. A method, comprising:
    forming a mask on a feature layer;
    patterning the mask to form a patterned mask having a first plurality of openings in the mask to expose portions of the feature layer;
    forming a carbon layer on the mask and the exposed portions of the feature layer; and
    forming a second plurality of openings in the feature layer, the patterned mask comprising opposite sides covered by portions of the carbon layer after the second plurality of openings is formed, wherein the portions of the carbon layer are disposed on one or more sidewalls of the mask, the portions of the carbon layer extending from a top layer of the patterned mask to a remaining portion of the exposed portion of the feature layer.

16. The method of claim 15, wherein the mask comprises doped carbon.

17. The method of claim 16, wherein the mask comprises boron doped carbon.

18. The method of claim 16, wherein the carbon layer comprises a graphene layer.

19. The method of claim 16, wherein the carbon layer comprises a plurality of graphene layers.

20. The method of claim 19, wherein the plurality of graphene layers is formed by a microwave-assisted chemical vapor deposition process.

* * * * *